United States Patent [19]
Brench

[11] Patent Number: 5,698,818
[45] Date of Patent: Dec. 16, 1997

[54] TWO PART CLOSELY COUPLED CROSS POLARIZED EMI SHIELD

[75] Inventor: Colin Edward Brench, Stow, Mass.

[73] Assignee: Digital Equipment Corporation, Maynard, Mass.

[21] Appl. No.: 629,292

[22] Filed: Apr. 8, 1996

[51] Int. Cl.⁶ .................................................. H05K 9/00
[52] U.S. Cl. .............................. 174/35 R; 174/35 MS; 174/51; 361/818
[58] Field of Search ............................ 361/816, 818, 361/800, 690, 692, 694; 174/51, 35 R, 35 MS; 330/68, 170; 334/85; 336/84 R

[56] References Cited

U.S. PATENT DOCUMENTS

| | | | |
|---|---|---|---|
| 4,567,317 | 1/1986 | Ehrlich et al. | 174/35 |
| 4,752,861 | 6/1988 | Niggl et al. | 361/383 |
| 4,956,750 | 9/1990 | Maggelet | 361/415 |
| 4,985,803 | 1/1991 | Pum et al. | 361/383 |
| 5,294,994 | 3/1994 | Robinson et al. | 348/825 |

*Primary Examiner*—Kristine L. Kincaid
*Assistant Examiner*—Kristina Soderquist
*Attorney, Agent, or Firm*—Ronald C. Hudgens; Arthur W. Fisher

[57] ABSTRACT

A cross polarized electromagnetic interference shield apparatus for an electronic device having a Faraday cage made of two sets of planar conductive plates. Each of the two sets of planar conductive plates have parallel aligned elongated apertures which are not aligned in the same direction, and are spaced apart at a predetermined distance. This arrangement provides improved EMI attenuation and improved air flow over prior planar EMI shields, at a lower cost than prior honeycomb shields.

20 Claims, 5 Drawing Sheets

TWO PART CLOSELY COUPLED CROSS POLARIZED EMI SHIELD

BACKGROUND OF THE INVENTION

1. Field of the Invention

This invention relates generally to shielding electronic devices from Electro-Magnetic Interference (EMI), and more specifically, to low cost planar EMI shields for high frequency electronic systems.

2. Prior Art

Generally, electronic devices emit Electro-Magnetic radiation as an unwanted by product of their operation. Electronic devices are also sensitive to outside Electro-Magnetic radiation which maybe mistakenly interpreted as internal data signals. Thus, electronic device operation may be interfered with by the action of outside Electro-Magnetic radiation. This is known as Electro-Magnetic Interference, or EMI. Therefore, it is necessary to protect electronic devices from external EMI, and also to prevent internal EMI from escaping and possibly interfering with other electronic devices. Protection from EMI is typically provided by surrounding the electronic device with a shield known as a Faraday cage. The shield is often made as a part of the physical enclosure or cabinet of the electronic device, and is usually grounded for safety and EMI reasons.

Electronic devices are also known to produce heat as an unwanted byproduct of their operation. An increase in temperature of the electronic device will result in a decrease in device reliability and functional lifetime. Thus it is often found necessary to actively cool the electronic device. One common method of cooling electronic devices is to have a fan blow cool outside air through the interior of the electronic device cabinet. This requires that the device cabinet contain openings that will allow the air to enter and to exit. As the opening size is increased, the air resistance is decreased, and thus the air flow rate and cooling increase. Thus there is a motivation in the art to maximize the total size of the cabinet openings, since this improves cooling efficiency and thereby increases device reliability and potential lifetime.

However, the larger the size of the cabinet opening, the more EMI that escapes. The maximum size of an allowable hole in the Faraday cage depends on the wavelength of the typical EMI radiation produced by the particular electronic device to be shielded. Generally, the faster the device is the shorter the resulting EMI radiation wavelength is (note that this is identical to saying higher frequencies), and consequently the smaller the maximum allowable hole size. This effect becomes more severe as the speed of the electronic device increases, since the faster devices also produce more heat as well as shorter wavelength EMI. Thus there is a conflict between making the cabinet holes larger to allow for more cooling, and making the cabinet holes smaller to better shield against EMI.

It is known in the art to make planar EMI shields which contain numerous small apertures or holes, where the allowable size of the holes is determined by the typical wavelength of the EMI produced by the electronic device. The number of holes, and therefore the total area of cabinet opening, is determined by the air flow required to cool the device, limited by the minimum required strength of the cabinet. Planar EMI shields are inexpensive, but the industry trend toward increased electronic device speeds has resulted in decreased allowable hole sizes, as well as ergonomic problems such as increased air flow sounds and whistling related to the decreased allowable hole size.

Another known method in the art is to use what are called "honeycomb" shields. Honeycomb shields are usually made up of hexagonal cells that are stacked together to make walls. The key to the operation of this type of shield is the depth or thickness of the honeycomb as compared to the size of the aperture opening. Honeycomb shields improve the ease of air flow without increased air flow noise or whistling. They also improve the quality of the EMI shielding and therefore can be used at higher electronic device speeds than planar EMI shields. However, honeycomb shields are more expensive and difficult to use in fabrication of electronic device cabinets than are planar shields.

Therefore, a need exists in the art for an inexpensive high performance EMI shield that allows high air flow.

BRIEF DESCRIPTION OF THE DRAWINGS

The above and further advantages of the invention may be better understood by referring to the following description in conjunction with the accompanying drawings, in which.

DESCRIPTION OF THE PREFERRED EMBODIMENTS

Figure 1:
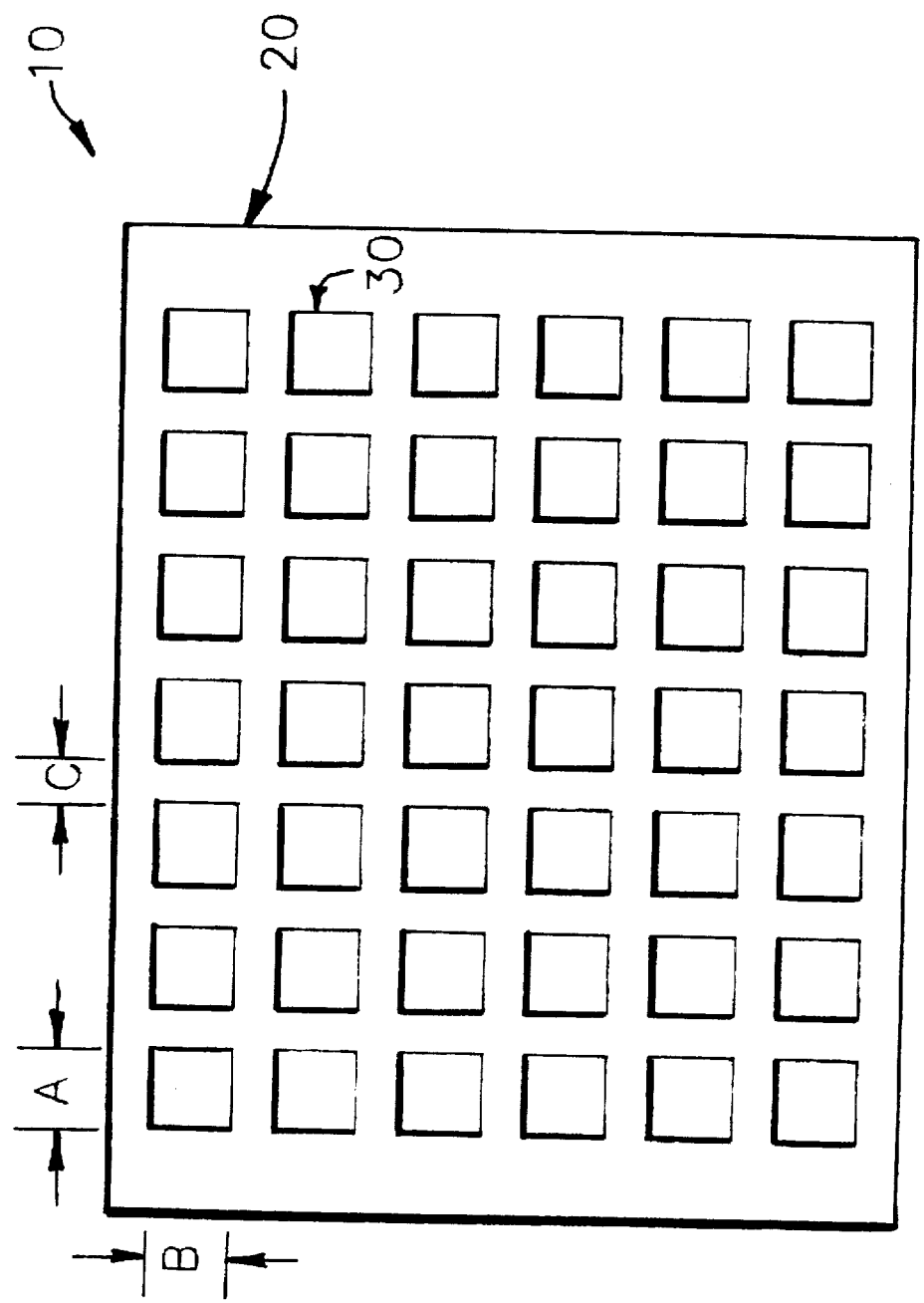
FIG. 1 is a representation of a prior art planar EMI shield.

FIG. 1 shows a prior art planar EMI shield panel 10. Shield panels like panel 10 of FIG. 1 can be of any desired shape or size, and are typically attached together to form the electronic device cabinet. If the shield panels are of an electrically conductive material, and if the panels are fabricated into a cabinet such that they are electrically connected to each other and to an electrical ground reference potential, then the device cabinet is considered to be what is known as a Faraday cage. The shield panel 10 is formed from a planar sheet of material 20, and possesses apertures or openings 30 that completely penetrate the planar sheet 20. The openings 30 allow air to flow into the cabinet for cooling purposes. The openings 30 have a length A, a width B and are spaced from each other by a distance C. The openings 30 are shown in this illustrative example as being rectangular with A and B dimensions being equal, but may have any shape desired.

A typical EMI shield would be comprised of a single layer of the planar material 20 formed into the desired electronic cabinet configuration, with each of the separate panels 10 electrically connected together, and to ground. The size, spacing and dimension of the openings 30 would depend on the amount of air flow required and the physical strength required for the panel 10. However, the openings 30 can not be allowed to be larger than the maximum size required to block the typical EMI wavelength produced by the electronic device contained within.

Figure 2:
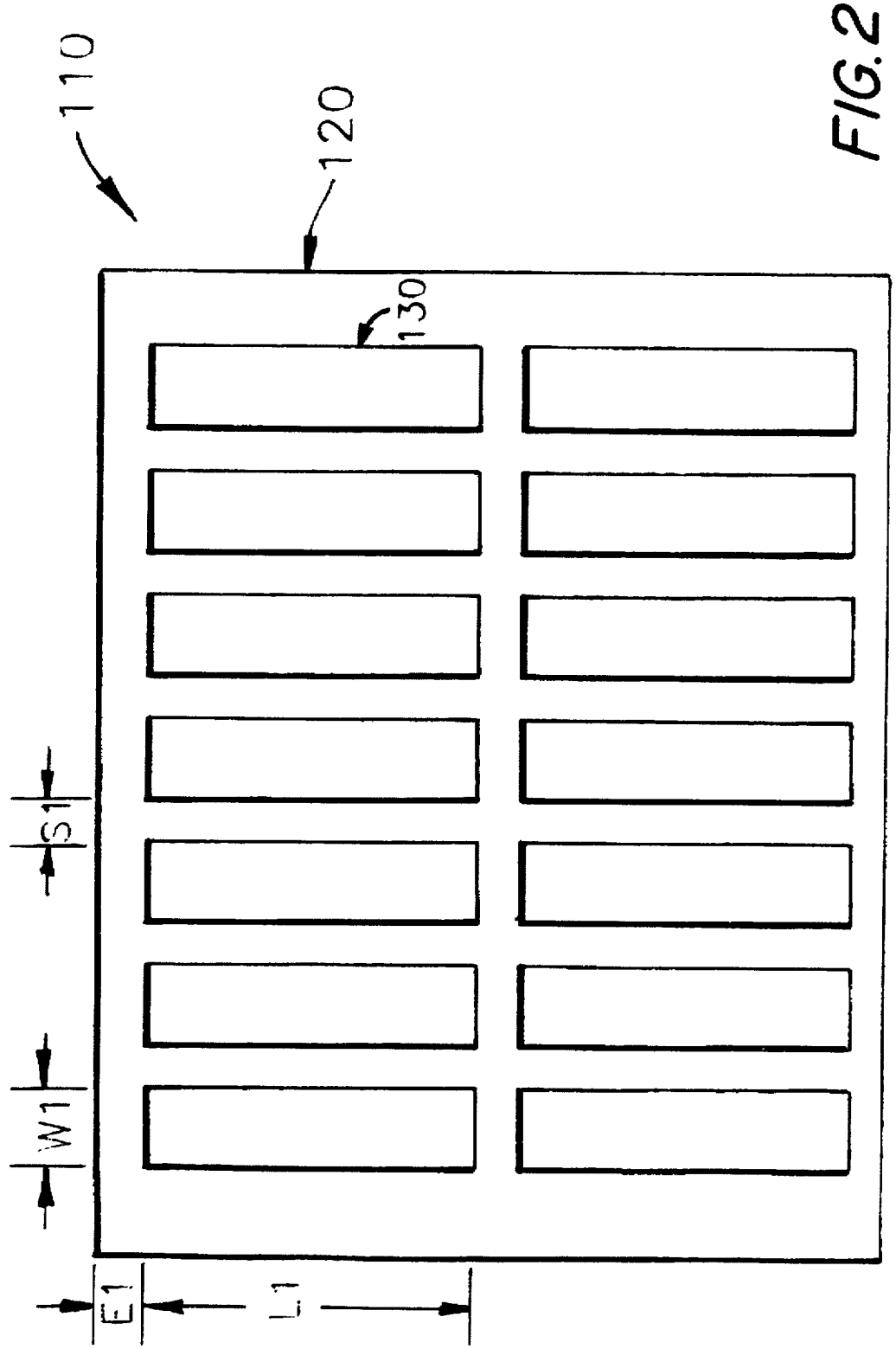
FIG. 2 shows a preferred implementation of one of two planar plates in accordance with the present invention.

FIG. 2 shows a first planar panel 110 in accordance with the present invention. The planar shield panel is formed from a planar sheet of conductive material 120, and possesses apertures or openings 130 that completely penetrate the planar sheet 120. The openings 130 have a length L1, a width W1 and are spaced from each other by a distance S1, and are spaced from the edge of the planar panel by a distance E1. The openings 130 are shown in this illustrative example as being rectangular, but may have any shape desired as long as the L1 and W1 dimensions are unequal and thus the aperture 130 is elongated, preferably with L1 greater than three times W1. The openings 130 are shown in this illustrative example as being vertically oriented, but may have any orientation desired.

Figure 3:
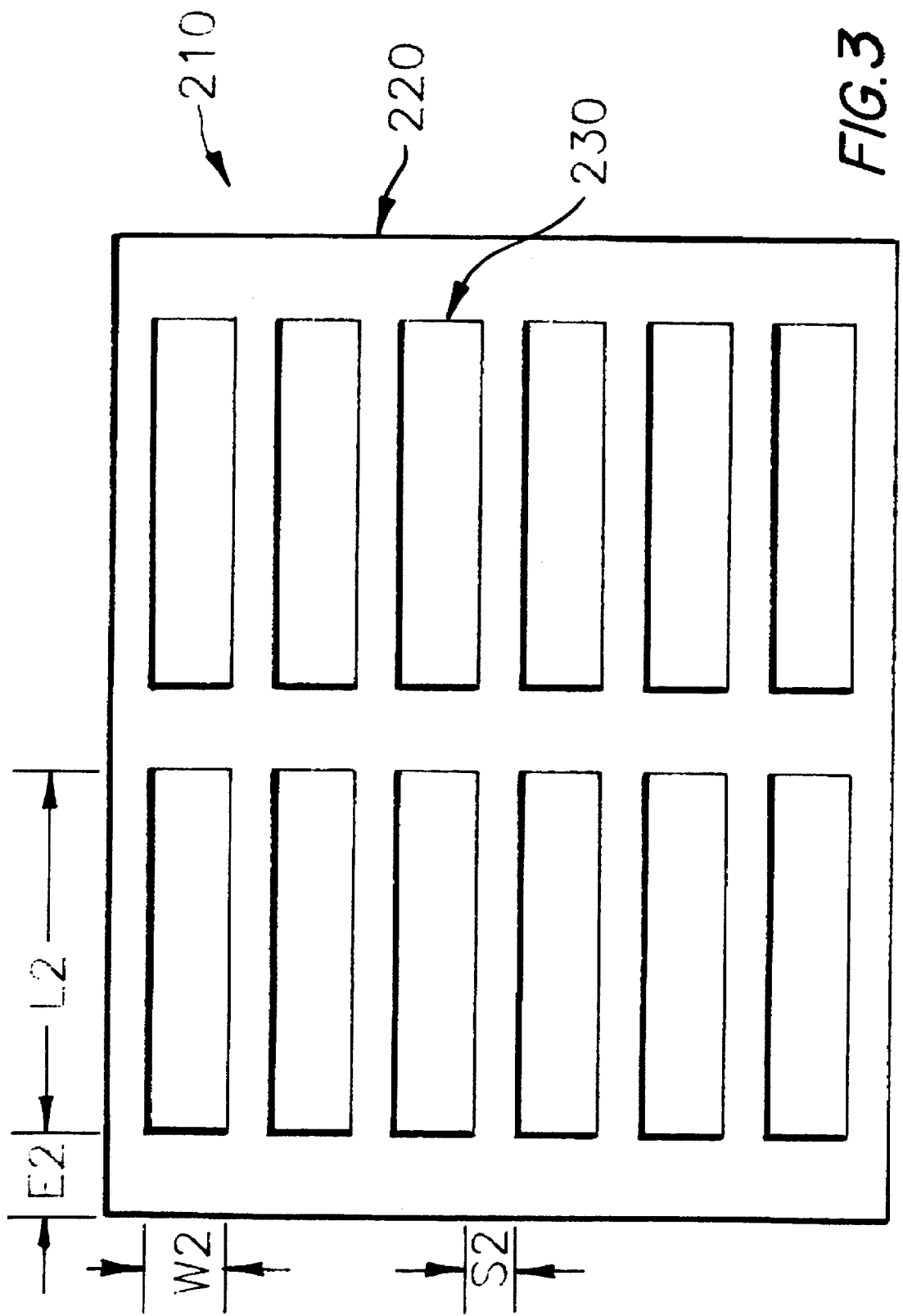
FIG. 3 shows a preferred implementation of the second of two plates in accordance with the present invention.

FIG. 3 shows the second planar panel 210 in accordance with this invention. The planar shield panel is formed from a planar sheet of conductive material 220, and possesses apertures or openings 230 that completely penetrate the planar sheet 220. The openings 230 have a length L2, a width W2 and are spaced from each other by a distance S2, and are spaced from the edge of the planar panel by a distance E2. The openings 230 are shown in this illustrative example as being rectangular, but may have any shape desired as long as they are elongated. The openings 230 are shown in this illustrative example as being horizontally oriented, but may have any orientation desired as long as they are not oriented in the same direction as the apertures or openings 130 in planar panel 110 of FIG. 2. Preferably, the openings 230 are oriented at approximately 90 degrees from the orientation of the openings 130 of FIG. 2, i.e., the two sets of openings should be roughly orthogonal.

Figure 4:
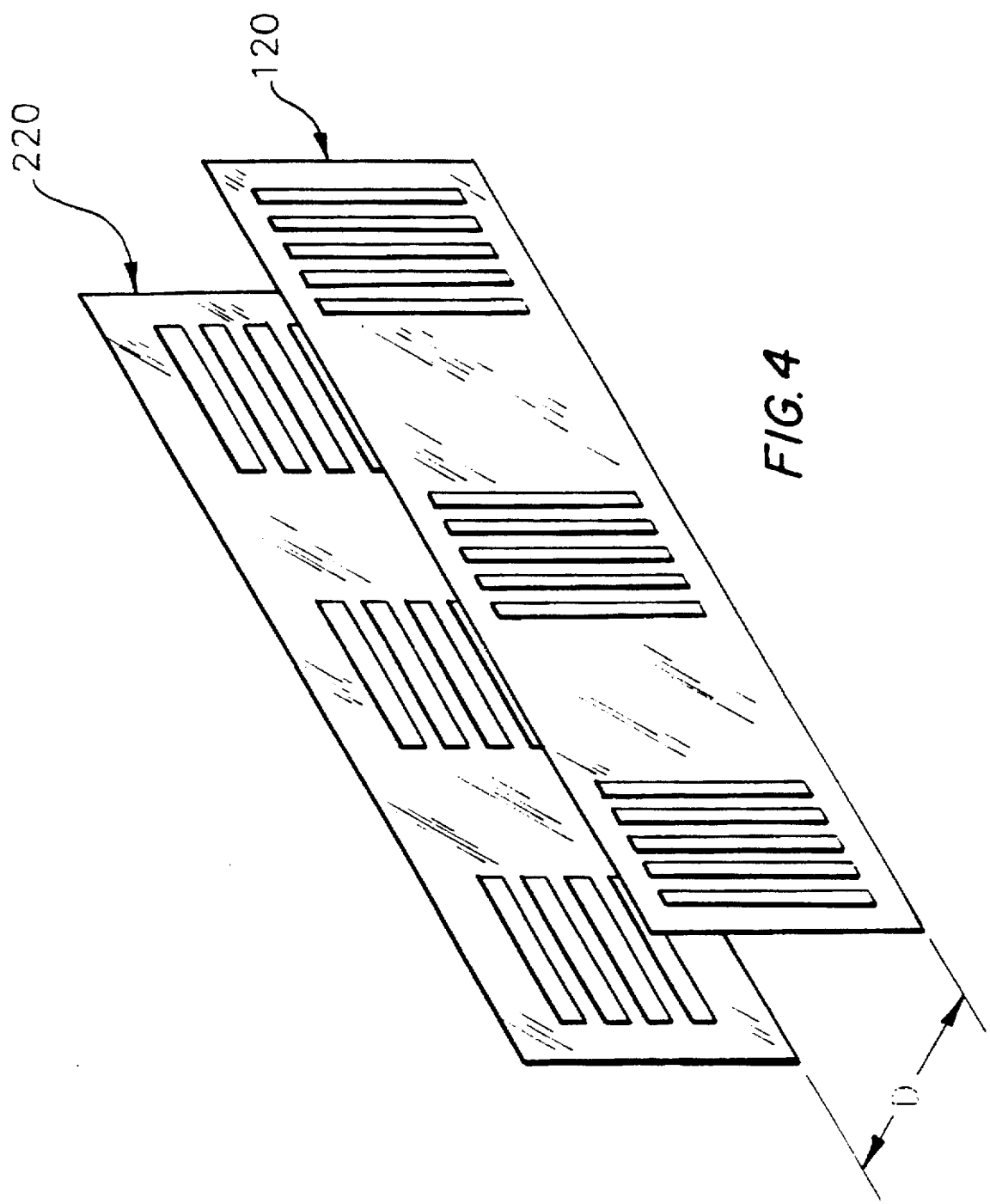
FIG. 4 is an isometric drawing of the two plates of FIGS. 2 and 3 showing the relationship between the two plates in accordance with the present invention.

FIG. 4 is an isometric drawing representing a preferred arrangement of the two planar panels of FIGS. 2 and 3 in accordance with the present invention. The two planar panels 120 and 220 are spaced apart in an approximately parallel orientation by a predetermined distance D, and held in position by mechanical supports (not shown). The mechanical supports may be pillars of length D placed and attached between the two panels, or may be a continuous strip of material of width D attached to the two planar panels around their entire perimeter, thereby forming a rectangular box.

In this illustrative example, the orientation of the rectangular openings are shown as being vertical and horizontal. However in general the openings need not be rectangular and they may be at any orientation desired. Furthermore, the respective openings in each panel need not be perpendicular to one another as shown as in FIG. 4, however they can not be parallel to one another.

Figure 5:
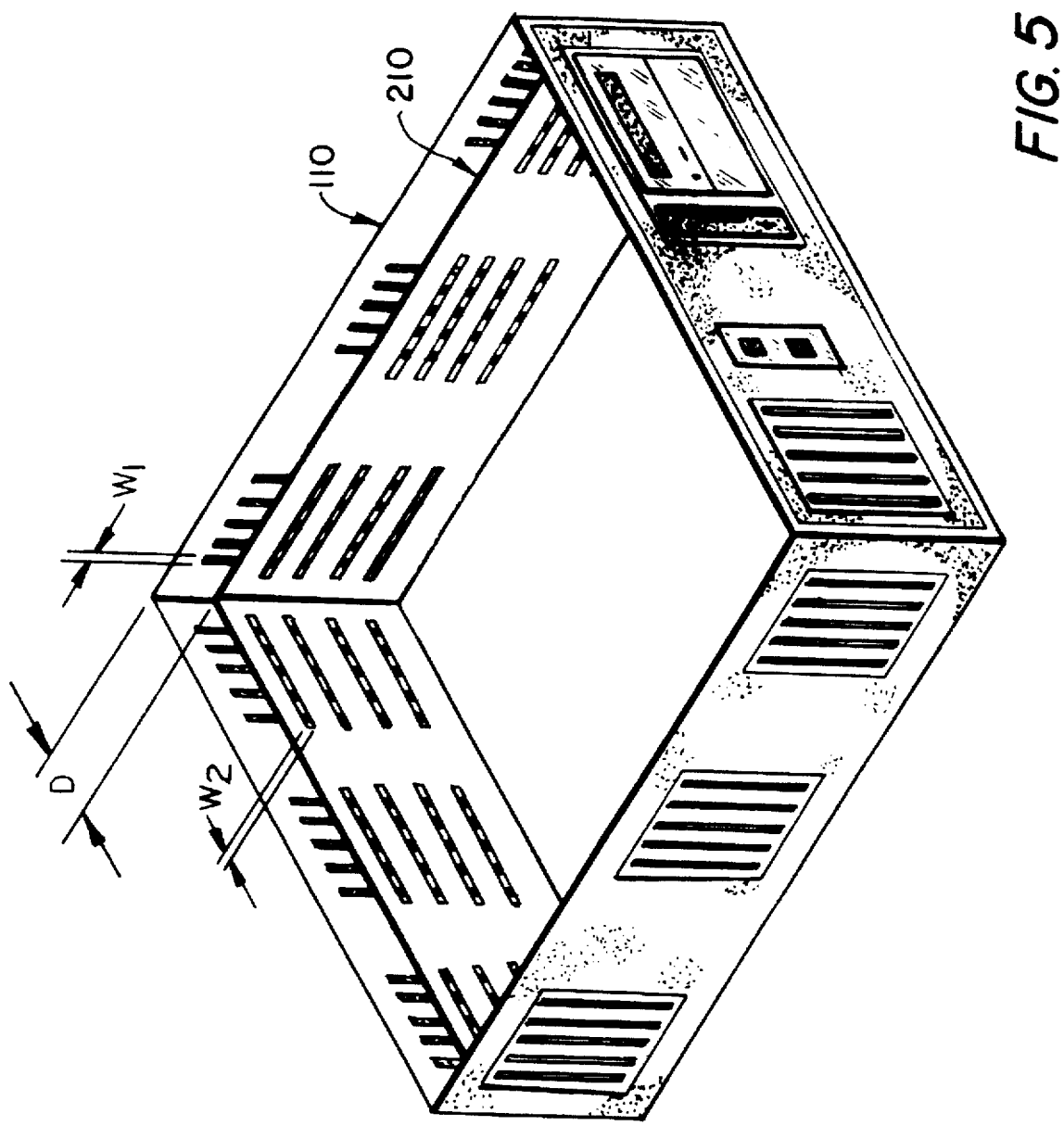
FIG. 5 is an isometric drawing of a group of four sets of the two plates of FIG. 4 showing the relationship between the sets of plates to form a box structure in accordance with the present invention.

FIG. 5 shows an isometric view of an electronic device enclosure or box comprised of four of the two panel sections shown in FIG. 4. The mechanical supports holding the roughly parallel plates of each set of plates apart by the distance D are not shown in this Figure for simplicity. The orientation of the rectangular openings 130 (also see FIG. 2) of width W1 are shown as being vertical on panels 110, and the openings 230 (also see FIG. 3) of width W2 are shown as being horizontal on panels 210. However in general the openings need not be rectangular and they may be at any orientation desired. Furthermore, the respective openings in each of the panels 110 and 210 need not be perpendicular to one another as shown as in the Figure, although the two sets of openings are preferably approximately perpendicular or orthogonal. In this illustrative example the overlap area of the rectangular openings in panels 110 and 210 can be seen and a representative member of these overlap areas is labeled 240.

The benefits achieved by this arrangement of planar EMI shield panels over the prior art are increased ease of air flow, improved EMI shielding efficiency over prior art planar EMI shields, and reduced cost over prior art honeycomb shields.

These benefits are obtained because the present arrangement of planar panels combines increased opening area while presenting a small opening cross section to EMI radiation. For example, assuming that the width (i.e. the narrow dimension) of each of the elongated openings in the two planar panels is the same as the size of the opening 30 in the prior art planar panel 20 from FIG. 1, and further assuming that the length of each of the elongated opening in the two planar panels is five times as great as the width, then the air flow through each of the two panels alone is five times as large as in the prior art case. This is true simply because the total opening area is five times as large as in the prior art case. An additional benefit to increasing the opening size is that for a given amount of air flow the larger the opening size the lower the air flow noise level produced. Air flow noise is an ergonomic problem that can affect the marketability of electronic systems, particularly systems for consumer use. The reason elongated openings were not previously used in the prior art is that the increased opening size has adverse effects on the amount of EMI radiation that escapes from the electronic device.

The present invention differs from the prior art in using two panels, each with large sized elongated openings aligned in an approximately perpendicular orientation to one another, at a fixed distance D. In the prior art the use of two parallel panels would not be desired because the use of two panels would simply double the resistance to air flow with little EMI protection improvement. However, experimentation with the configuration of panels claimed in the present invention has shown that the use of two panels together reduces the total air flow by only 30% over the use of one single panel alone, if the distance D between the panels is correctly controlled. Thus the air flow is not impeded as much as would have been expected from the prior art.

The increased size of the openings in the shielding would be expected to increase the amount of EMI leakage since it is known in the prior art that increases in opening size causes a concomitant increase in EMI leakage. However, the "apparent" or equivalent cross sectional opening size of the combination of the two approximately orthogonal sets of elongated openings is equal to the area of overlap of the two superimposed apertures or openings. In this case the overlapping openings are exactly equal to the prior art opening area since the assumed widths (i.e., W1 and W2 in FIGS. 2 and 3) of the two elongated openings are exactly equal to the prior art opening size. In addition, experimentation has shown that the proper choice of the spacing between the two planar panels causes a close electrical coupling and improves the attenuation of the EMI radiation over the prior art planar EMI shields. The present arrangement with W1 and W2 being approximately 1–3 millimeters, and L1 and L2 being approximately 5–15 millimeters, has been found to yield acceptable results up to an electronic device operating speed of 6 Giga Hz, which is an improvement over the prior art planar shields.

The prior art honeycomb EMI shields also work well in the indicated frequency range but are more expensive and difficult to use in fabricating electronic device cabinets. Thus, through the use of the claimed arrangement, it is possible to both increase air flow while simultaneously improving EMI shielding efficiency over the prior art planar EMI shields without incurring the expense of using honeycomb shielding.

What is claimed is:

1. A cross polarized electromagnetic interference shield for an electronic device comprising:

a grounded Faraday cage surrounding said electronic device, comprising;

a first plurality of planar conductive plates and a second plurality of planar conductive plates;

each of said first plurality of planar conductive plates having a first plurality of parallel aligned elongated apertures therein;

each of said second plurality of planar conductive plates having a second plurality of parallel aligned elongated apertures therein;

each of said first and second pluralities of elongated apertures having a predetermined length, width, separation from an edge of one of the planar conductive plates and separation from adjacent ones of said pluralities of elongated apertures; and each one of said first plurality of plates disposed adjacent to a respective one of said second plurality of plates at a predetermined distance such that said second plurality of parallel aligned elongated apertures are not aligned in the same direction as said first plurality of parallel aligned elongated apertures of said first plurality of planar conductive plates.

2. The shield of claim 1 wherein said first and second pluralities of planar conductive plates are comprised of a metal.

3. The shield of claim 2 wherein said metal is Aluminum.

4. The shield of claim 1 wherein said first and second pluralities of planar conductive plates are comprised of a metallic wire embedded in a plastic.

5. The shield of claim 1 wherein said first and second pluralities of elongated apertures are rectangular.

6. The shield of claim 1 wherein said first plurality of elongated apertures is aligned perpendicular to said second plurality of elongated apertures.

7. The shield of claim 1 wherein said first plurality of elongated apertures is aligned vertically, and said second plurality of elongated apertures is aligned horizontally.

8. The shield of claim 1 wherein said predetermined distance between adjacent plates is less than said predetermined length of said elongated apertures.

9. A cross polarized electromagnetic interference shield for an electronic device comprising:

a grounded Faraday cage surrounding said electronic device, comprising;

a first plurality of planar rectangular conductive plates having a first surface and a second plurality of planar rectangular conductive plates having a second surface;

each of said first plurality of planar rectangular conductive plates having a first plurality of vertical elongated apertures therethrough in said first surface;

each of said second plurality of planar rectangular conductive plates having a second plurality of horizontal elongated apertures therethrough in said second surface;

each one of said first plurality of planar rectangular conductive plates disposed adjacent to a respective one of said second plurality of planar rectangular conductive plates at a predetermined distance, such that a major portion of said first surface and of said second surface are parallel and facing one another at said predetermined distance; and each of said plurality of elongated apertures having a predetermined length, width, separation from an edge of one of the planar conductive plates and separation from adjacent ones of said plurality of elongated apertures.

10. The shield of claim 9 wherein said first and second pluralities of planar conductive plates are comprised of a metal.

11. The shield of claim 10 wherein said metal is Aluminum.

12. The shield of claim 9 wherein said first and second pluralities of planar conductive plates are comprised of a metallic wire embedded in a plastic.

13. The shield of claim 9 wherein said first and second pluralities of elongated apertures are rectangular.

14. The shield of claim 9 wherein said predetermined distance between adjacent plates is less than said predetermined length of said elongated apertures.

15. A cross polarized electromagnetic interference shield for an electronic device comprising:

a grounded Faraday cage surrounding said electronic device, comprising;

a first plurality of planar conductive plates and a second plurality of planar conductive plates;

each of said first plurality of planar conductive plates having a plurality of vertical rectangular apertures therein;

each of said second plurality of planar conductive plates having a plurality of horizontal rectangular apertures therein;

each one of said first plurality of plates disposed adjacent to a certain one of said second plurality of plates at a predetermined distance; and each of said plurality of rectangular apertures having a predetermined length, width, separation from an edge of one of the planar conductive plates and separation from adjacent ones of said plurality of rectangular apertures.

16. The shield of claim 15 wherein said first and second pluralities of planar conductive plates are comprised of a metal.

17. The shield of claim 16 wherein said metal is Aluminum.

18. The shield of claim 15 wherein said first and second pluralities of planar conductive plates are comprised of a metallic wire embedded in a plastic.

19. The shield of claim 15 wherein said predetermined distance between adjacent plates is less than said predetermined length of said rectangular apertures.

20. The shield of claim 15 wherein said predetermined width of said plurality of rectangular apertures is between 1 and 3 millimeters, and wherein said predetermined length of said plurality of rectangular apertures is between 5 and 15 millimeters.

* * * * *